United States Patent

Sato

[11] Patent Number: 6,034,574
[45] Date of Patent: Mar. 7, 2000

[54] MODULATION APPARATUS

[75] Inventor: Hideaki Sato, Yokohama, Japan

[73] Assignee: Canon Kabushiki Kaisha, Tokyo, Japan

[21] Appl. No.: 09/044,017

[22] Filed: Mar. 19, 1998

[51] Int. Cl.[7] .............. H03C 1/08; H03C 1/00; H01P 1/10; H01P 1/15
[52] U.S. Cl. ............ 332/164; 332/106; 332/177; 333/258
[58] Field of Search ............... 332/106, 163, 332/164, 177; 331/49, 68, 96, 117 D, 107 DP, 107 SL, 173; 329/354, 370

[56] References Cited

U.S. PATENT DOCUMENTS

| | | | |
|---|---|---|---|
| 3,845,485 | 10/1974 | Parker et al. | 343/106 R |
| 4,463,330 | 7/1984 | Yoneyama | 333/239 |
| 5,055,805 | 10/1991 | Kan | 333/21 |
| 5,392,051 | 2/1995 | Uematsu et al. | 342/165 |
| 5,394,154 | 2/1995 | Uematsu et al. | 342/165 |
| 5,717,400 | 2/1998 | Vematsu et al. | 342/165 |

FOREIGN PATENT DOCUMENTS

| | | |
|---|---|---|
| 6-268445 | 9/1994 | Japan . |
| 6-268446 | 9/1994 | Japan . |
| 6-268447 | 9/1994 | Japan . |
| 6-291552 | 10/1994 | Japan . |
| 8-65015 | 3/1996 | Japan . |

OTHER PUBLICATIONS

IEICE Trans. Commun., vol. E79–B, No. 12, Dec. 1996, pp. 1759–1764 "NRD Guide Digital Transceivers for Millimeter Wave LAN System", Kuroki, F. et al.

*Primary Examiner*—David Mis
*Attorney, Agent, or Firm*—Fitzpatrick, Cella, Harper & Scinto

[57] ABSTRACT

A modulation apparatus connected to a termination edge of a waveguide path has a matching circuit, a detection diode for detecting a high-frequency signal inputted from the waveguide path, a resistor consumes a detection output of the detection diode, a transmission signal source controls a bias of the detection diode in accordance with a transmission signal, and a high-frequency choke. The high-frequency signal inputted when the detection diode is in a cut-off condition is reflected to the waveguide path. The high-frequency signal inputted when the detection diode is conductive is detected in the detection diode and consumed in a resistor.

26 Claims, 4 Drawing Sheets

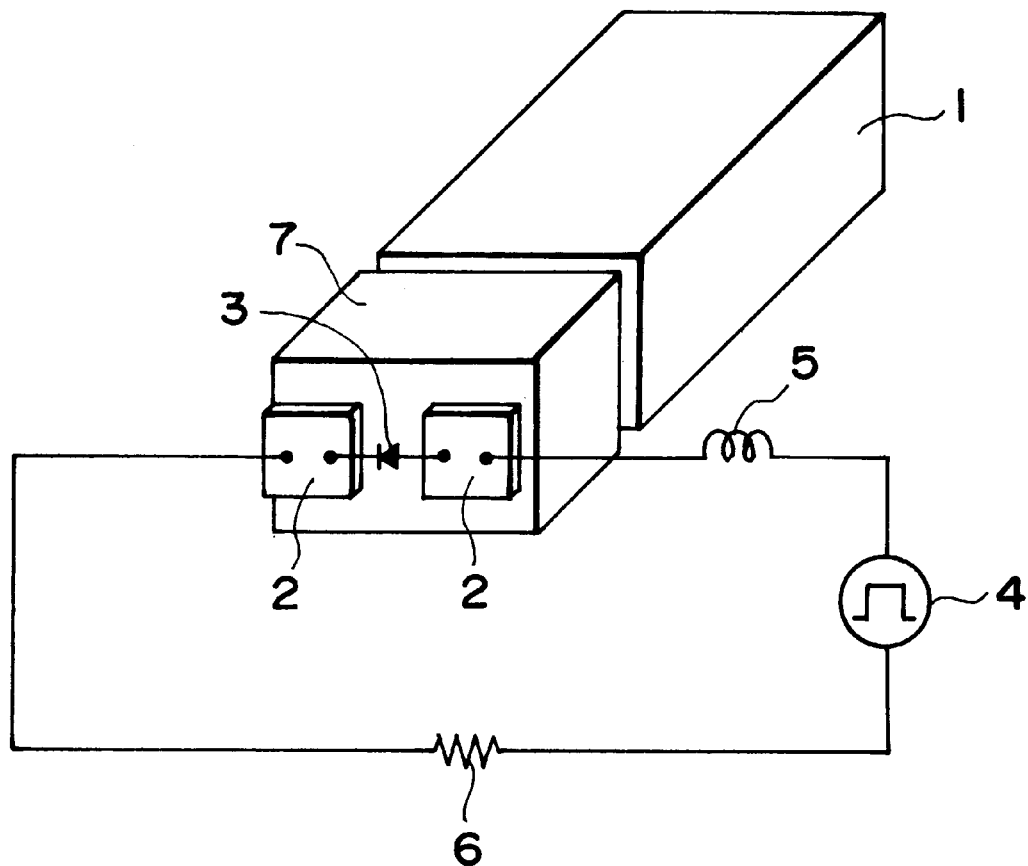
F I G. 1
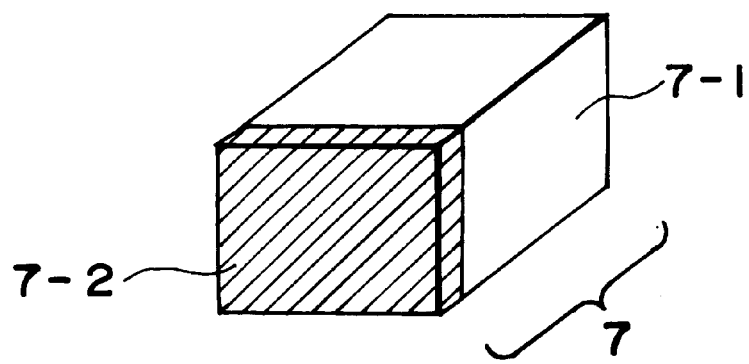
F I G. 2

MODULATION APPARATUS

BACKGROUND OF THE INVENTION

1. Field of the Invention

The present invention relates to a modulation apparatus for modulating an extreme high frequency radio wave such as a millimeter wave.

2. Related Background Art

Conventionally, in order to modulate an extreme high frequency radio wave such as millimeter wave, a modulation is performed by controlling impedance being a partial structural element of a waveguide path (including a waveguide, a plane waveguide path or the like) which is a path of the radio wave in a transmitter in response to a signal to be transmitted and varying an amplitude of the radio wave to be outputted.

As an example of modulation technique of this system, a system using a PIN diode as a variable impedance element has been known. For example, such the system is described in detail in "NRD Guide Digital Transceiver for Millimeter Wave LAN System", IEICE TRANS. COMMUN., Vol. E79-B No. 12 December 1996.

This thesis describes a communication system using an NRD guide (nonradiative dielectric waveguide) as a communication medium.

FIG. 5 is a perspective view showing basic structure of the NRD guide.

The NRD guide, which has an upper conductive plate 101 and a lower conductive plate 102 mutually located in parallel, is mediately composed of a dielectric strip 103 constituting a dielectric line between the conductive plates 101 and 102. The conductive plates 101 and 102 are formed out of plane metal plates and the dielectric strip 103 is formed out of a fluororesin.

If an interval between the conductive plates 101 and 102 is maintained to be less than or equal to half a free-space wavelength of a frequency to be used, the transference of an electromagnetic wave in polarization parallel to the wall is interrupted and thus the electromagnetic wave is transferred along the dielectric strip 103. Preferably, the width of the dielectric strip 103 is set to be substantially equal to half the above-described wavelength.

FIG. 6A shows the structure of a PIN diode modulator described in the above thesis.

Metal plates 61 and 62 correspond to the conductive plates 101 and 102 respectively. A dielectric strip 63 corresponds to the dielectric strip 103 shown in FIG. 5. An electromagnetic wave RF 64 is transferred along the dielectric strip 63. Reference numeral 65 denotes a modulated electromagnetic wave, 66 denotes an air gap, 67 denotes a dielectric piece, 68 denotes a high-permittivity sheet and 69 denotes a beamlead diode mount.

FIG. 6B shows detailed structure of the beamlead diode mount 69.

Reference numeral 71 denotes a beamlead-type GaAs PIN diode, 72 denotes a pair of electrodes, and 73 denotes a bias choke.

The PIN diode 71 featuring high frequency operation is bounded between the electrodes 72 in the NRD guide beamlead diode mount 69. The mount 69 is sandwiched in the dielectric strip 63. Reflected power from the PIN diode 71 with high level of a digital signal can be reduced by placing the high-permittivity sheet 68 in front of the mount 69. The air gap 66 placed in the dielectric strip 63 acts as a reactive element. This gap becomes a useful tool to completely suppress residual reflection. Using such matching technique, the transmitting waves can be passed or reflected depending on the applied high and low levels of the digital signals to the PIN diode 71. The reflected power is absorbed by matched load connected with a circulator.

Subsequently, the principle of a modulator called as a reflection-type modulator in the related background art will be explained.

In FIG. 4, a waveguide path 21 acts as an input unit for inputting the millimeter wave before being modulated and an output unit for outputting the millimeter wave after being modulated. A pair of electrodes 22 arranged at an edge of a matching circuit 27 also acts as a pad to hold a diode. Reference numeral 23 denotes a PIN diode. A switching circuit is formed by the electrodes 22 and the PIN diode 23. Reference numeral 24 denotes a source of a transmission information signal modulated to be transmitted. Reference numeral 25 denotes a high-frequency choke. The matching circuit 27 performs matching with the switching circuit arranged at an edge of the waveguide path 21. Reference numeral 28 denotes a reflectionless termination.

In this structure, the millimeter wave inputted to the waveguide 21 is applied to the switching unit, which is composed of the electrodes 22 and the PIN diode 23, through the matching circuit 27.

On the other hand, signal voltage to be transferred is applied to the PIN diode 23 from the signal source 24 through the high-frequency choke 25 to act as a vias voltage for the diode. Therefore, at the time when a positive bias is supplied to the diode 23, the diode is in a conductive condition. At the time when a zero or inverse bias is supplied to the diode 23, the diode is in an interruptive condition. That is, a switching operation is conducted according to the signal.

When the diode 23 is in the conductive condition, if the matching circuit 27 is arranged such that characteristic impedance of the waveguide 21 is matched with characteristic impedance of a portion including the PIN diode 23, the electrodes 22 and the reflectionless termination 28, then an input millimeter wave is absorbed in the reflectionless termination 28, and any reflection does not occur. When the diode 23 is in the interruptive condition, mismatch occurs and the input millimeter wave is reflected and returned to the waveguide 21.

The reflection-type modulator is constituted as above.

Since the PIN diode does not actually perform a detecting operation in a millimeter wave band, the reflectionless termination is indispensable in the conductive condition.

However, in this reflection-type modulator, such structure as preventing secondary reflection to an input side is indispensable by arranging the reflectionless termination 28 behind the diode 23, thereby resulting in complicated structure.

Also, the PIN diode operating in the millimeter wave band is ordinarily made by a diode such as GaAs or the like, thereby resulting in relatively high cost.

SUMMARY OF THE INVENTION

An object of the present invention is to improve a modulation apparatus modulating high frequency.

An another object of the present invention is to minimize in size the modulation apparatus modulating high frequency.

A still another object of the present invention is to structure the modulation apparatus modulating high frequency in at low cost.

A still another object of the present invention is to improve reliability in the modulation apparatus modulating high frequency.

A still another object of the present invention is to provide the modulation apparatus comprising:

an input means for inputting a high-frequency signal;

a detection means for detecting the input high-frequency signal;

a control means for controlling the detection means in accordance with a transmission signal; and a consumption means for consuming a detection output from the detection means.

A still another object of the present invention is to provide the modulation apparatus comprising:

a detection means provided in a waveguide path used to transfer a high-frequency signal;

a control means for controlling impedance of the detection means in accordance with a transmission signal; and a consumption means for consuming a detection output from the detection means.

A still another object of the present invention is to provide the modulation apparatus comprising:

a reflection means, provided at a termination edge of a waveguide path, for reflecting a high-frequency signal inputted through the waveguide path in accordance with a transmission signal, the reflection means further comprising, a detection means for detecting the high-frequency signal inputted from the waveguide path, a control means for controlling the detection means in accordance with the transmission signal, and a consumption means for consuming a detection output from the detection means.

A still another object of the present invention is to provide the modulation apparatus comprising:

a switching means provided at a termination edge of a waveguide path, the switching means further comprising, a detection means for detecting a high-frequency signal inputted through the waveguide path, and a consumption means for consuming a detection output from the detection means, wherein impedance of the detection means is controlled in accordance with a transmission signal.

The above and other objects of the present invention will become apparent from the following embodiments.

BRIEF DESCRIPTION OF THE DRAWINGS

FIG. 1 is a view showing structure of a modulator in an embodiment of the present invention;

FIG. 2 is a view showing detailed structure of a matching circuit shown in FIG. 1;

DETAILED DESCRIPTION OF THE PREFERRED EMBODIMENTS

Figure 3:
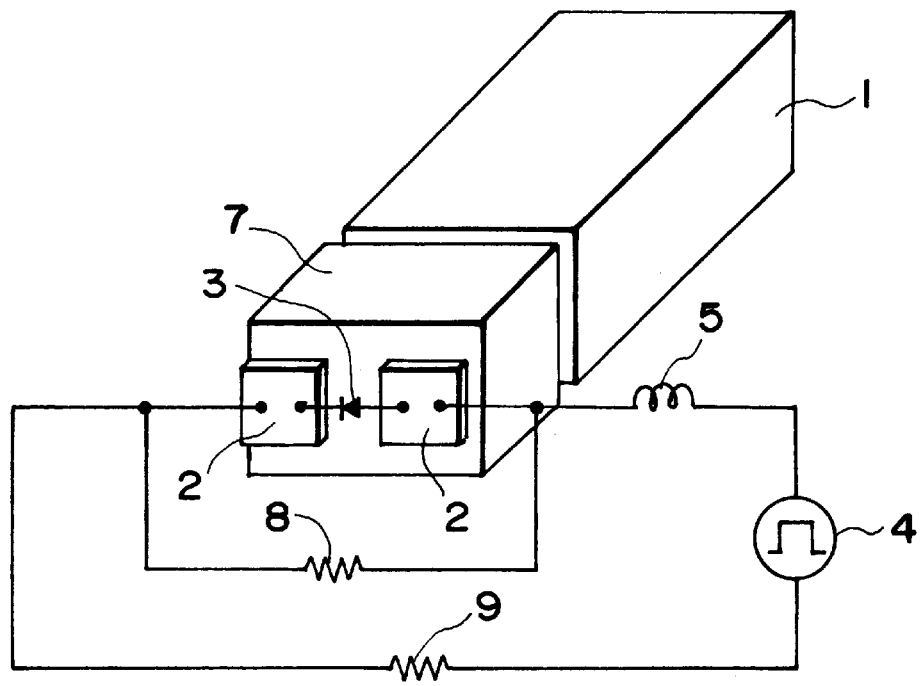
FIG. 3 is a view showing structure of a modulator in an another embodiment of the present invention.
Figure 4:
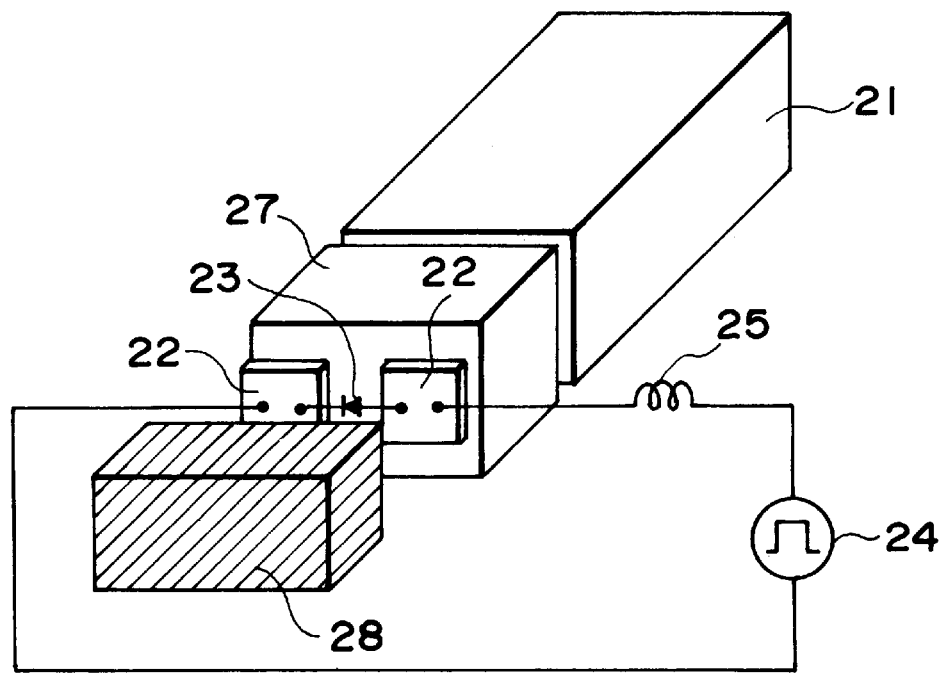
FIG. 4 is a view showing a principle of a modulator called as a reflection-type modulator in related background art.

Hereinafter, the embodiments of the present invention will be described in detail with reference to the accompanying drawings. In the embodiments, in order to perform modulation to a millimeter wave band wherein an extreme high-frequency radio wave such as a millimeter wave is modulated, partial impedance in elements of a waveguide path (includes waveguide, plane waveguide path or the like) acting as a path of the radio wave in a transmitter is controlled in response to a signal to be transferred, thereby varying amplitude of the radio wave to be outputted.

Concretely, a reflection-type modulation system is adopted as a modulation system, and a detection diode is used as a variable impedance element. In the millimeter wave band, for example, a Schottky-barrier diode (SBD) or the like can be used as the detection diode.

FIG. 1 shows the structure in the embodiment of the present invention.

In FIG. 1, the waveguide path 1 (waveguide) acts as an input unit for inputting the millimeter wave before being modulated and an output unit for outputting the millimeter wave after being modulated. A pair of electrodes 2 arranged at an edge of a matching circuit 7 acts as a pad for holding a diode. Reference numeral 3 denotes a detection diode which is used for detection. In the embodiment, the electrodes 2 and the diode 3 constitute a switching circuit.

Reference numeral 4 denotes a source of a transmission information signal to be modulated and transmitted. Reference numeral 5 denotes a high-frequency choke. Reference numeral 6 denotes a resistor which consumes and heat converts a detection output from the detection diode 3. Reference numeral 7 denotes the matching circuit which performs matching with the switching circuit arranged at an edge of the waveguide path 1. A signal voltage corresponding to transference information generated from the signal source 4 is applied to the diode 3 through the resistor 6 and the choke 5, and acts as a bias of the diode 3.

The millimeter wave inputted to the waveguide path 1 is applied to a detection unit composed of the electrodes 2 and the diode 3, through the matching circuit 7. The matching circuit 7 is arranged such that characteristic impedance of a portion including the detection diode 3 and the electrodes 2 is matched with characteristic impedance of the waveguide path 1 when the detection diode 3 is positively biased and in the conductive condition.

Figure 5:
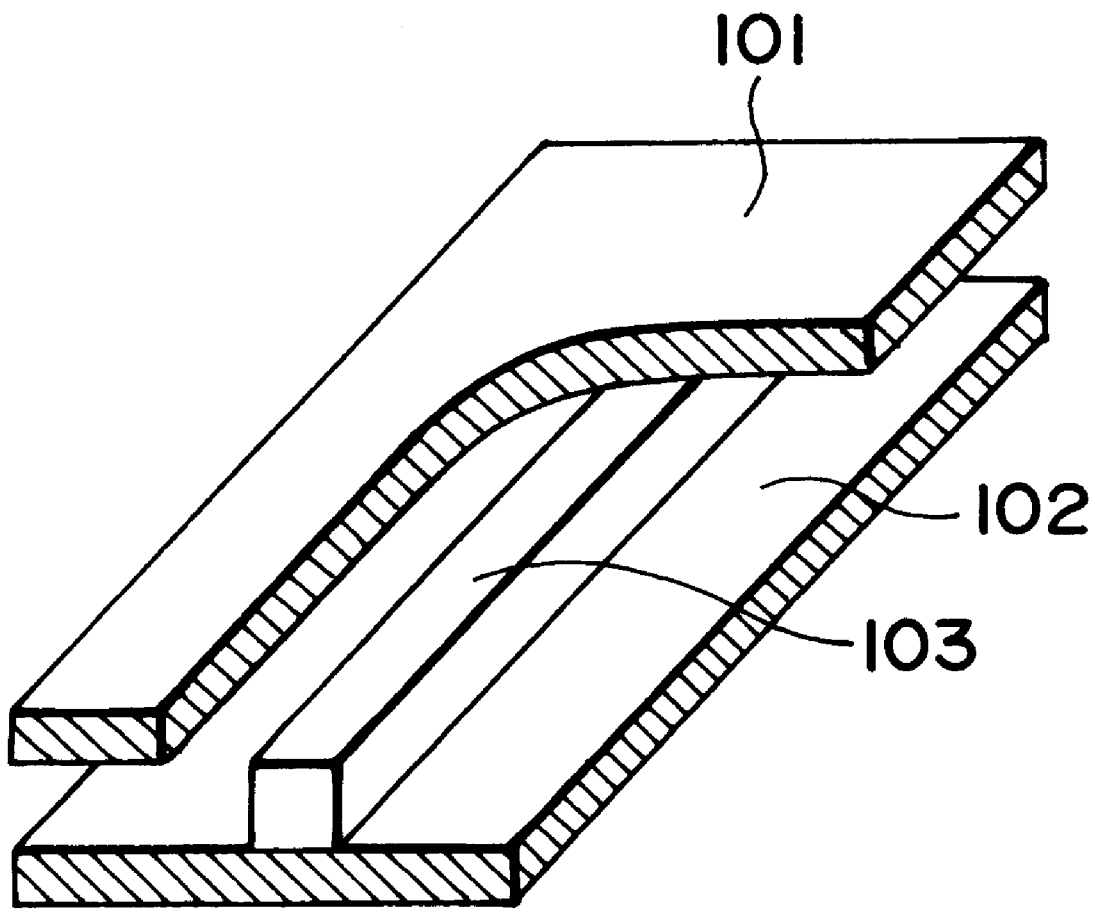
FIG. 5 is a perspective view of a conventional NRD guide.
Figure 6A:
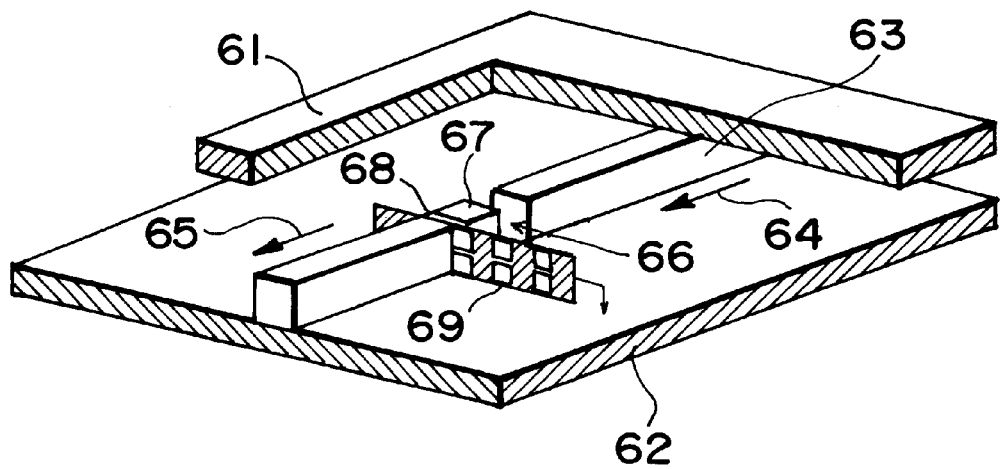
FIGS. 6A and 6B are views showing structure of a conventional PIN diode modulator.
Figure 6B:
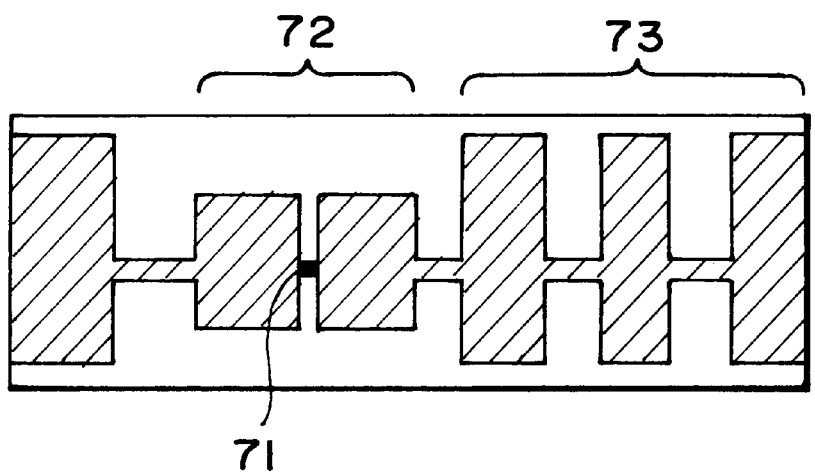

The waveguide path 1 corresponds to a dielectric strip 103 shown in FIG. 5, and the input/output millimeter wave is transferred along an NRD guide. It should be noted that FIG. 1 refrains from showing conductive plates 101 and 102. The matching circuit 7 corresponds to a dielectric piece 67 and a high-permittivity sheet 68 in FIGS. 6A and 6B, and a gap corresponds to an air gap 66 in FIG. 6A is provided between the waveguide path 1 and the matching circuit 7. The high-frequency choke 5 can be formed in the same manner as in FIG. 6B. However, in the present embodiment, the choke 5 has a value of, e.g., 5 nH and the resistor 6 has a value of, e.g., 50 Ω.

A waveguide path other than the dielectric strip of the NRD guide may be used as the waveguide path 1.

FIG. 2 concretely shows a detailed example of the structure of the matching circuit 7 shown in FIG. 1. For example, as the matching circuit 7, there is provided such structure as adding a thin plate 7-2 formed by high-permittivity material to a tip of a waveguide path member 7-1 which is the same as the waveguide path 1 constituting a modulator. The matching circuit 7 is arranged between the waveguide path 1 and the diode 3 such that the high-permittivity thin plate 7-2 is on the side of the diode 3 for modulation.

The waveguide path member 7-1 corresponds to the dielectric piece 67 in FIG. 6A, and the thin plate 7-2 corresponds to the high-permittivity sheet 68 in FIG. 6A.

In the present embodiment, by the above structure, the following operation is performed. That is, when the positive bias is supplied to the diode 3, the diode 3 comes to be in a conductive condition and thus acts as a detector. On the other hand, when the zero or inverse bias is supplied to the diode 3, the diode 3 comes to be in a cut-off condition, whereby the matching between the waveguide path 1 and the detection circuit is broken. Therefore, a quantity of reflection wave to be returned to the waveguide path 1 is controlled due to the bias condition of the diode 3. That is, the millimeter wave inputted to the waveguide path 1 is reflected in the detection circuit including the diode 3 and again returned to the waveguide path 1. In this manner, when the millimeter wave is outputted, an input signal is modulated by output signal voltage from the signal source 4.

As described above, according to the embodiment of the present invention, since the resistor 6 is arranged in series to the diode 3, the signal source 4 and the high-frequency choke 5, the diode 3 acts as the detector in the positively biased condition. Therefore, after the input millimeter wave is detected and converted into a direct current in the diode 3, the obtained direct current is absorbed and heat converted. Thus, it can be suppressed that the input millimeter wave is reflected into the side of the waveguide path 1.

Oppositely, in the condition that the zero or inverse bias is being supplied to the detection diode 3, a quantity of reflection of the input millimeter wave into the side of the waveguide path 1 can be increased.

In the above description, the example of arranging the resistor 6 in series to the diode 3, the signal source 4 and the high-frequency choke 5 was explained. However, the present invention is not limited to the above example, i.e., the resistor may be added in parallel to the detection diode.

An another embodiment of the present invention structured as above will be explained as follows with reference to FIG. 3. In the another embodiment shown in FIG. 3, the same components as in the embodiment shown in FIG. 1 are added with the same reference numerals and the detailed description thereof are omitted.

As compared with the embodiment shown in FIG. 1, the embodiment shown in FIG. 3 is different in the point that a resistor 8 is added in parallel to the detection diode 3.

By applying the structure shown in FIG. 3, a reliable modulating operation can be secured even if speed of a signal to be transferred is high. That is, it is desirable to maintain impedance of a signal transmission line at a specific value (e.g., 50 Ω). However, even if the impedance of the diode 3 is significantly varied according to variation in the speed of a transmission signal to be supplied from the signal source to the detection diode 3, the variation in the impedance at such a varied portion can be seemingly maintained to be constant since the resistor 8 (50 Ω) is arranged in parallel to the diode 3. A resistor 9 has a value of about 3 Ω.

As described above, the present invention has been explained on the basis of the preferable embodiments. However, the present invention is not limited to such the embodiments, but may be modified in various manners within the scope of the following claims.

What is claimed is:

1. A modulation apparatus comprising:
   input means for inputting a high-frequency signal;
   detection means for detecting the inputted high-frequency signal;
   control means for controlling said detection means in accordance with a transmission signal; and
   consumption means for consuming a detection output of said detection means.

2. An apparatus according to claim 1, further comprising output means for outputting a high-frequency signal which is not detected by said detection means.

3. An apparatus according to claim 1, further comprising reflection means for reflecting the high-frequency signal which is not detected by said detection means to said input means.

4. An apparatus according to claim 1, further comprising matching means between said input means and said detection means.

5. An apparatus according to claim 1, wherein said detection means includes a diode.

6. An apparatus according to claim 5, wherein said control means controls a bias of the diode.

7. An apparatus according to claim 1, wherein said consumption means includes a resistor.

8. An apparatus according to claim 1, further comprising a high-frequency choke connected in series to said detection means and said control means.

9. An apparatus according to claim 1, wherein said detection means and said consumption means are connected in parallel.

10. An apparatus according to claim 1, wherein said input means inputs the high-frequency signal from a dielectric line which is mediately equipped between an upper conductive plate and a lower conductive plate which are arranged in parallel each other.

11. An apparatus according to claim 1, wherein said control means controls impedance of said detection means in accordance with a transmission signal.

12. A modulation apparatus comprising:
   detection means provided in a waveguide path used to transfer a high-frequency signal;
   control means for controlling impedance of said detection means in accordance with a transmission signal; and
   consumption means for consuming a detection output of said detection means.

13. An apparatus according to claim 12, wherein said detection means includes a diode.

14. An apparatus according to claim 12, wherein said consumption means includes a resistor.

15. A modulation apparatus comprising:
   reflection means, provided at a termination edge of a waveguide path, for reflecting a high-frequency signal inputted from the waveguide path in accordance with a transmission signal, wherein said reflection means comprises,
   detection means for detecting the high-frequency signal inputted from the waveguide path,
   control means for controlling said detection means in accordance with the transmission signal, and
   consumption means for consuming a detection output of said detection means.

16. An apparatus according to claim 15, wherein said reflection means includes matching means for matching the waveguide path and said detection means.

17. An apparatus according to claim 16, wherein said reflection means includes a pair of electrodes for connecting said detection means to said matching means.

18. An apparatus according to claim 15, wherein said detection means includes a diode.

19. An apparatus according to claim 15, wherein said control means controls a bias of said detection means in accordance with the transmission signal.

20. An apparatus according to claim 15, wherein said consumption means includes a resistor.

21. An apparatus according to claim 15, further comprising a high-frequency choke connected to said detection means.

22. An apparatus according to claim 15, wherein said control means controls impedance of said detection means in accordance with the transmission signal.

23. A modulation apparatus comprising:

switching means provided at a termination edge of a waveguide path, wherein said switching means comprises,
detection means for detecting a high-frequency signal inputted from the waveguide path, and
consumption means for consuming a detection output of said detection means, and wherein impedance of said detection means is controlled in accordance with a transmission signal.

24. An apparatus according to claim 23, wherein characteristic impedance of said switching means, when said detection means is in a conductive condition, is matched with characteristic impedance of the waveguide path.

25. An apparatus according to claim 23, wherein said switching means comprises reflection means for reflecting the high-frequency signal inputted from the waveguide path, when said detection means is in a cut-off condition.

26. A modulating method comprising the steps of:

inputting a high-frequency signal;

detecting the inputted high-frequency signal;

controlling said detection step in accordance with a transmission signal; and consuming a detection output of said detection step.

* * * * *

UNITED STATES PATENT AND TRADEMARK OFFICE
CERTIFICATE OF CORRECTION

PATENT NO.         : 6,034,574
APPLICATION NO. : 09/044017
DATED                : March 7, 2000
INVENTOR(S)       : Hideaki Sato It is certified that error appears in the above-identified patent and that said Letters Patent is hereby corrected as shown below:

ON THE TITLE PAGE [30] :

FAPD, insert
-- [30] Foreign Application Priority Data
March 21, 1997 [JP] . . . . . . . 9-068070--.

ON THE TITLE PAGE [56] References Cited :

U.S. PATENT DOCUMENTS, "Vematsu et al." should read
--Uematsu et al. --

ON THE TITLE PAGE [57] ABSTRACT :

Line 4, "consumes" should read --consuming--; and
Line 5, "controls" should read --controling--.

COLUMN 1 :

Line 20, "the" should read --a--;
Line 37, "an" should read --the--; and
Line 38, "a" should read --the--.

COLUMN 2 :

Line 29, "vais" should read --bias--;
Line 62, "An another" should read --Another--; and
Line 67, "in at" should read --at--.

COLUMN 4:

Line 47, "is" should be deleted.

UNITED STATES PATENT AND TRADEMARK OFFICE
CERTIFICATE OF CORRECTION

| | |
|---|---|
| PATENT NO. | : 6,034,574 |
| APPLICATION NO. | : 09/044017 |
| DATED | : March 7, 2000 |
| INVENTOR(S) | : Hideaki Sato |

It is certified that error appears in the above-identified patent and that said Letters Patent is hereby corrected as shown below:

<u>COLUMN 6</u> :

Lines 28-29, "in parallel each" should read --parallel to each--.

Signed and Sealed this

Twenty-fourth Day of July, 2007

JON W. DUDAS
*Director of the United States Patent and Trademark Office*